Sept 3, 1957 D. K. WILSON 2,805,370
ALLOYED CONNECTIONS TO SEMICONDUCTORS
Filed April 26, 1956
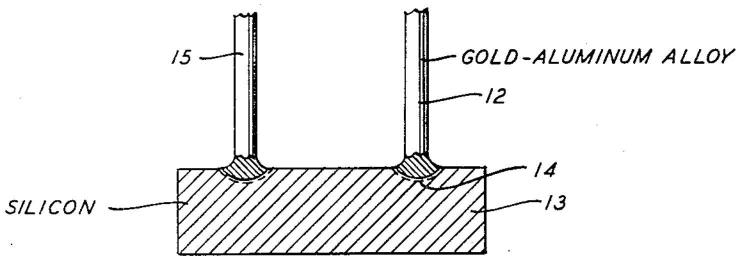
INVENTOR
D. K. WILSON
BY D. H. Wilson, Jr.
ATTORNEY

2,805,370

ALLOYED CONNECTIONS TO SEMICONDUCTORS

Donald K. Wilson, Rochester, N. Y., assignor to Bell Telephone Laboratories, Incorporated, New York, N. Y., a corporation of New York Application April 26, 1956, Serial No. 580,921

4 Claims. (Cl. 317—240)

This invention relates to semiconductive translating devices and more particularly to alloyed connections to silicon bodies.

In the fabrication of silicon translating devices either rectifying or ohmic connections are made by external leads to the silicon body. It is, of course, desirable to attain as high a reverse impedance and as high a rectification ratio as possible, when a rectifying connection is made to the body and also to attain a purely ohmic connection for the other type of connection. To attain this, various metallic leads are known.

It is a general object of this invention to provide an improved electrical connection to a silicon semiconductor body.

More specifically it is an object of this invention to improve the electrical characteristics of alloyed connections to silicon.

It is a further object of this invention to attain an electrical connection to silicon having rectifying characteristics with respect to p-type material and ohmic characteristics with respect to n-type material.

In accordance with one aspect of my invention an electrical connection is made by alloying a gold-aluminum element or lead to silicon. Although aluminum and alloys of aluminum act as acceptor impurities in forming aluminum-silicon alloy electrical connections, I have found that the combination of elements in accordance with my invention functions as a donor in silicon. Thus, a gold-aluminum element alloyed to p-type silicon provides a rectifying connection, while a similar element alloyed to n-type silicon forms an ohmic connection therewith.

One feature of this invention is a silicon semiconductive translating device which has alloyed electrical connections thereto, the connections comprising a gold-aluminum lead element.

It is another feature of this invention that the gold-aluminum element contain from about 0.1 percent by weight to about two percent by weight aluminum and the remainder gold. A gold-aluminum lead in accordance with this invention when alloyed with p-type silicon provides not an ohmic connection but a rectifying connection, and when alloyed with n-type silicon provides not a rectifying connection but an ohmic one.

The above and additional objects and features of this invention will be more fully appreciated from the following detailed description of typical gold-aluminum contacts to silicon and methods of forming such contacts when read with reference to the accompanying drawing illustrating a rectifier utilizing a contact according to this invention.

Referring to the drawing, an alloy contact silicon rectifier is shown wherein a gold-aluminum wire 12 is alloy bonded to a p conductivity type silicon wafer 13 to form a rectifying barrier region 14 intermediate the two. A pure aluminum wire 15 alloyed to the wafer 13 at some point spaced from the barrier region provides a low resistance, nonrectifying, base contact for the rectifier. As discussed below, the mechanism forming the barrier region is not understood, however, it is believed that a conversion of the silicon adjacent the wire from p conductivity type to n-type or intrinsic occurs. This conversion is attributed to the introduction of donor centers into the silicon in sufficient quantities to compensate for the presence of acceptor centers. The donors may be introduced by diffusion, as a residual component in the regrown silicon deposited therein during its refreezing from the molten silicon-gold-aluminum solution, or by a combination of these means.

Rectifiers have been produced in accordance with this invention on a p-type silicon wafer derived from a single crystal of silicon by etching the sandblasted surfaces of the silicon wafer in an etchant composed of 15 parts of 48 percent hydrofluoric acid, 15 parts of acetic acid, and 25 parts of nitric acid (1.42 specific gravity), hereafter referred to as CP4, for about 45 seconds to one minute to reveal an undisturbed crystalline surface. A rectifying connection is made to the silicon by mounting a five mil wire composed of 98 percent by weight gold and two percent by weight aluminum against the cleaned surface and heating the wire and wafer combination in the vicinity of the interface between the two to a temperature in the range of from about 700° C. to about 900° C. An ohmic contact can be made to the silicon by alloying a pure aluminum wire, for example of five mils diameter, to the surface with a similar heat treating cycle.

In performing these alloying steps the portions of the contact elements which engage the silicon should be freshly cut in order to provide a clean metallic face which will readily wet the silicon. The alloying operations can either be performed simultaneously or, where it is desired to employ different alloying temperatures, separately. In the latter case, the contact alloying at the lower temperature advantageously is formed last. The alloyed assembly is subjected to a short etch, for example 10 to 15 seconds in CP4, in order to eliminate any portions of the alloyed connection which may have flowed across the rectifying junction at the silicon surface, thereby removing possible leakage paths for reverse currents.

The gold-aluminum contact can be alloyed to the silicon by any of a number of convenient heating cycles. Where it is not necessary to establish a particular orientation in the junction formed by the alloying process, the silicon wafer can be mounted on a carbon strip heater which is raised to the alloying temperature, about 865° C. for example, in about five seconds. Alloying can then be permitted to proceed for about 10 seconds at the alloying temperature and the alloyed region cooled in 15 seconds to about 300° C. Alternatively, where it is important to avoid the introduction of thermal strains or it is desired to regrow a substantial thickness of silicon on the interface between the unmelted portions of the wafer and the molten material, the alloyed region can be gradually cooled from the maximum temperature.

A rectifier, fabricated as described above from p-type silicon of from 1.5 to 2 ohm-centimeters resistivity and having a five mil diameter junction offers a current in the forward direction of one milliampere with an applied voltage of one volt. In the reverse direction the current saturates at about .001 microampere up to about 70 volts and offers a sharp breakdown at 70 volts. Thus, it will be seen that the structure offers excellent rectifying characteristics and at one volt the rectification ratio for a device of this nature is about one million.

An element comprising an alloy of two percent aluminum in gold which has been alloyed to n-type silicon offers a very low resistance, ohmic contact. Such a contact can be formed in the same manner as described above.

The anamolous behavior of contacts made from the combination of aluminum and gold on silicon is not understood at present. Investigations have revealed that mixtures of these materials of about 0.1 percent aluminum and the remainder gold to about two percent aluminum and the remainder gold can conveniently be alloyed to silicon to produce excellent contacts of the type normally achieved with alloying materials containing substances which function as donors in silicon. Both aluminum and gold have heretofore been considered to be acceptors. One explanation for the effects observed in this range of compositions for these materials arises from the belief that aluminum and gold form a compound which functions as a donor. Evidence of the existence of this compound was observed when attempts were made to fabricate contact elements containing greater than about two percent of aluminum with gold. These elements were extremely brittle and therefore did not lend themselves to utilization in device fabrication. This undesirable brittle composition, accordingly, places an upper limit on the quantity of aluminum which is employed in a contact in accordance with this invention. On the other hand, the lower limit on the defined composition, namely 0.1 percent aluminum, is established by the loss of effectiveness of the alloying material as a donor when the proportion of aluminum is reduced below this level. Within the range of 0.1 percent to two percent aluminum, where the remainder is gold, the alloy contacts have been found to be effective both electrically and mechanically such that any composition in this range will provide an ohmic contact to n-type silicon and a rectifying contact to p-type silicon.

While the preceding description has been directed to a rectifier structure, it is to be understood that gold-aluminum alloy contacts to silicon can be employed in many other forms of signal translating devices. Further, these contacts can be employed in structures in combination with other forms of contacts than that illustrated, including those of the solder type, alloy type, and pressure type, and other silicon body forms, including those containing grown rectifying junctions, metal-silicon junctions, or rectifying junctions resulting from the introduction of appropriate materials at some intermediate stage in the body fabrication.

What is claimed is:

1. A semiconductive translating device comprising a silicon body and a mass of gold and aluminum containing from about 0.1 percent by weight to about two percent by weight aluminum alloyed with a portion of said body.

2. A device in accordance with claim 1 wherein said body portion is of p conductivity type and a rectifying barrier exists in the interfacial region between said body portion and said gold-aluminum mass.

3. A device in accordance with claim 1 wherein said body portion is of n conductivity type and a low resistance, symmetrical connection exists between said body portion and the gold-aluminum mass.

4. A semiconductive translating device comprising a silicon body and means defining an electrical connection to said body, said means comprising a lead of gold and aluminum alloyed with said body and serving to introduce donor impurities into said body.

References Cited in the file of this patent

UNITED STATES PATENTS 2,705,768 Kleimack et al. ---------- Apr. 5, 1955